United States Patent
Smith et al.

(10) Patent No.: US 9,454,007 B1
(45) Date of Patent: Sep. 27, 2016

(54) FREE-SPACE LENS DESIGN AND LENSES THEREFROM

(71) Applicant: Lockheed Martin Corporation, Bethesda, MD (US)

(72) Inventors: David A. Smith, Cary, NC (US); Gregory A. Harrison, Oviedo, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 328 days.

(21) Appl. No.: 13/889,075

(22) Filed: May 7, 2013

Related U.S. Application Data

(60) Provisional application No. 61/643,427, filed on May 7, 2012.

(51) Int. Cl.
| | |
|---|---|
| *G02B 27/14* | (2006.01) |
| *G02B 27/01* | (2006.01) |
| *G06F 17/50* | (2006.01) |

(52) U.S. Cl.
CPC ........... *G02B 27/0172* (2013.01); *G06F 17/50* (2013.01)

(58) Field of Classification Search
CPC ............ G02F 2203/26; H04B 10/508; H04B 10/505; H01S 3/0057
USPC ................................ 359/264, 290–296, 633
See application file for complete search history.

(56) References Cited

U.S. PATENT DOCUMENTS

| | | | | |
|---|---|---|---|---|
| 3,841,760 | A  * | 10/1974 | Guyton | 356/124 |
| 5,500,652 | A  * | 3/1996 | Huber et al. | 345/84 |
| 6,236,511 | B1 * | 5/2001 | Brown | 359/634 |
| 8,180,606 | B2 | 5/2012 | Hicks | |
| 8,403,503 | B1 | 3/2013 | Geng | |
| 2007/0040924 | A1* | 2/2007 | Cho, II | G02B 26/0825 348/335 |
| 2007/0041077 | A1* | 2/2007 | Seo | H04N 5/7458 359/291 |
| 2009/0325217 | A1* | 12/2009 | Luscher | G01N 15/1404 435/29 |
| 2012/0013988 | A1* | 1/2012 | Hutchin | 359/631 |
| 2012/0123742 | A1 | 5/2012 | Harrison et al. | |
| 2012/0154920 | A1 | 6/2012 | Harrison et al. | |

* cited by examiner

*Primary Examiner* — Vipin Patel
(74) *Attorney, Agent, or Firm* — Jetter & Associates, P.A.

(57) ABSTRACT

A method of designing lenses includes defining a material having an inside reflective surface spanning an area, and providing an optical design algorithm which defines a plurality of oxels across the area. Each oxel has a plurality of sub-elements including a center sub-element and a plurality of neighboring sub-elements. Based on a defined optical prescription for the inside reflective surface, an optically corrected reference 3D surface is calculated for each oxel having spherical and cylindrical corrections relative to a spherical contour which spans a predetermined field of view (FOV) with respect to a single (common) predetermined reference point. A position of at least a first of the sub-elements for each of the oxels is moved to respective final 3D positions on the optically corrected reference 3D surface, where the moving is constrained to be along an individual line connecting each of the first sub-elements to the single predetermined reference point.

6 Claims, 7 Drawing Sheets

FREE-SPACE LENS DESIGN AND LENSES THEREFROM

CROSS REFERENCE TO RELATED APPLICATIONS

This application claims the benefit of Provisional Application Ser. No. 61/643,427 entitled "WIDE FIELD OF VIEW FREE-SPACE LENS DESIGN AND LENSES THEREFROM", filed May 7, 2012, which is herein incorporated by reference in its entirety, and is a continuation-in-part (CIP) of a first related patent application Ser. No. 13/211,389 entitled "Methods and Systems for Creating Free Space Reflective Optical Surfaces" and a second related patent application Ser. No. 13/211,372 entitled "Head-Mounted Display Apparatus Employing One or More Reflective Optical Surfaces".

FIELD

Disclosed embodiments relate to optical design methods and lenses therefrom.

BACKGROUND

Imaging of a large field of view (also known as angle of view) available at the same time instant is needed for a wide variety of applications. For example, a wide field of view (FOV) is often used in optical systems that provide viewing for a user, such as augmented reality systems. In augmented reality systems the FOV may be too wide to be seen all at the same time instant by a user, so that the user may have to turn their eyes to see all of the image. However, a wide field of view at the same time instant may be difficult to achieve with a single optical element (e.g., a lens).

SUMMARY

Disclosed free space lenses have passive reflective three dimensional (3D) surfaces which provide a wide field of view available at the same time instant, such as at least 100 degrees. -Such lenses can be created by the oxel design method described herein. Oxels are each small optical systems typically on the order of 50 μm to 1 mm in each in-plane direction, such as in one particular embodiment there are 500 oxels across a 4 inch surface, for 0.2 mm×0.2 mm oxels that express 3D surface curvature at surface locations. A large number of oxels (by way of non-limiting example, thousands) are part of a larger optical system that upon data smoothing and fabrication become reflective optical elements that collectively provide a disclosed reflective 3D surface.

Throughout this Disclosure, the following phrases/terms shall have the following meanings/scope:
  (1) The phrase "a reflective 3D surface" shall include surfaces that are only reflective as well as surfaces that are both reflective and transmissive. In either case, the reflectivity can be only partial, i.e., part of the incident light can be transmitted through the surface. Likewise, when the surface is both reflective and transmissive, the reflectivity and/or the transmissivity can be partial.
  (2) The phrase "field of view" and its abbreviation FOV refer to the "apparent" field of view in image (eye) space as opposed to the "real" field of view in object (i.e., display) space.

Disclosed free space lenses are not created by polynomials expressing the z-axis height referenced to an x-y plane as is done in free-form lenses. Instead, disclosed reflective 3D surfaces can be designed using oxels in any location in 3D space, in any direction, and can even wrap around past 180 degrees, which would be difficult to represent as a height above an x-y plane. Each of the optical systems associated with the small surface areas from the respective oxels are smoothed over the whole intended optical surface after being adjusted to obtain a low overall error relative to an optically corrected reference 3D surface which has spherical and cylindrical corrections relative to a spherical contour based on a defined optical prescription.

An optical prescription defines the surface curvature at all points on the optical elements, and is based on a set of optical constraints, that allows the intended physical optic effect to be achieved. For example, one optical prescription is a consistent focal distance for virtual objects across the area of an optically corrected reference 3D surface despite an angular spread of incident light from a pixel source having a plurality of pixels to each of the plurality of oxels (and resulting reflective optical surfaces) on the optically corrected 3D surface. For real-world applications, a suitable fabrication method (e.g., 3D printing) is used to convert the oxel-defined surface 3D curvature to a disclosed reflective 3D surface.

The plurality of oxels on the reflective 3D surface are expressible as a point cloud, where the point cloud is convertible into tangible disclosed reflective lens. A point cloud is a set of vertices in a three-dimensional coordinate system, defined by 3-coordinates, such as x, y, and z coordinates, which represent the external surface of an object.

Disclosed embodiments recognize when shaping a lens in the wide FOV free-space optical design method, the lens may change in width due to unconstrained optical adjustments. A change in width of the lens generally results in a different angular FOV as compared to the desired FOV, and is thus undesirable.

During disclosed lens design, processing the movement (correction) of the neighboring sub-surface elements of the oxels is constrained, such as to move only along an individual fixed line connecting each of the neighboring sub-surface elements to a fixed (single, common) reference point (e.g., a reference point associated with a proscribed eye location of a user). Each sub-surface element point has its own vector to the fixed reference point, such as the center (point) of the eye. There are thus multiple individual fixed lines, one fixed line per sub-surface element. A uniqueness of disclosed reflective 3D surfaces apart from the uniqueness otherwise provided by optical surfaces produced through use of the oxel design method relating to oxel by oxel custom/separate optical prescriptions, is that such reflective 3D surfaces provide a certain designed-in FOV.

The FOV is established with respect to a fixed reference location, such as a reference point in the eye of a user in the case a head mounted display (HMD) apparatus application, and thus not-necessarily a circular cone with steradian extents along the sphere centered at the center of the eye established as the extents required for the expanse of the reflective 3D surface. Subsequently all motion during the design that is directed by the oxel method with respect to establishing the correct optical surface is constrained to take place along an individual fixed ray (line) that extends from the fixed single reference point/location (e.g., center of the eye) and piercing the center of each oxel. Unlike other known optical design methods, disclosed methods preserve the desired FOV in all specified directions as the surface undergoes adaptation to establish the desired optical properties.

Disclosed design methods thus use a vector of motion for each oxel surface in the reflective 3D surface to ensure that the surface only moves on a vector with respect to a single fixed reference point, for instance the 3D point corresponding to center of the eye. Other processing is involved in determining the position of the surface in 3D space (described below), so that the actual surface is constrained to move along a vector from the central point out. Constraining the motion of the oxel surfaces during the adaptations maintains the desired angular FOV. The neighboring sub-elements of the oxels may be moved, or instead the center sub-elements of the respective oxels may be moved to implement the surface adaptation to satisfy a given optical prescription.

DETAILED DESCRIPTION

Figure 1A:
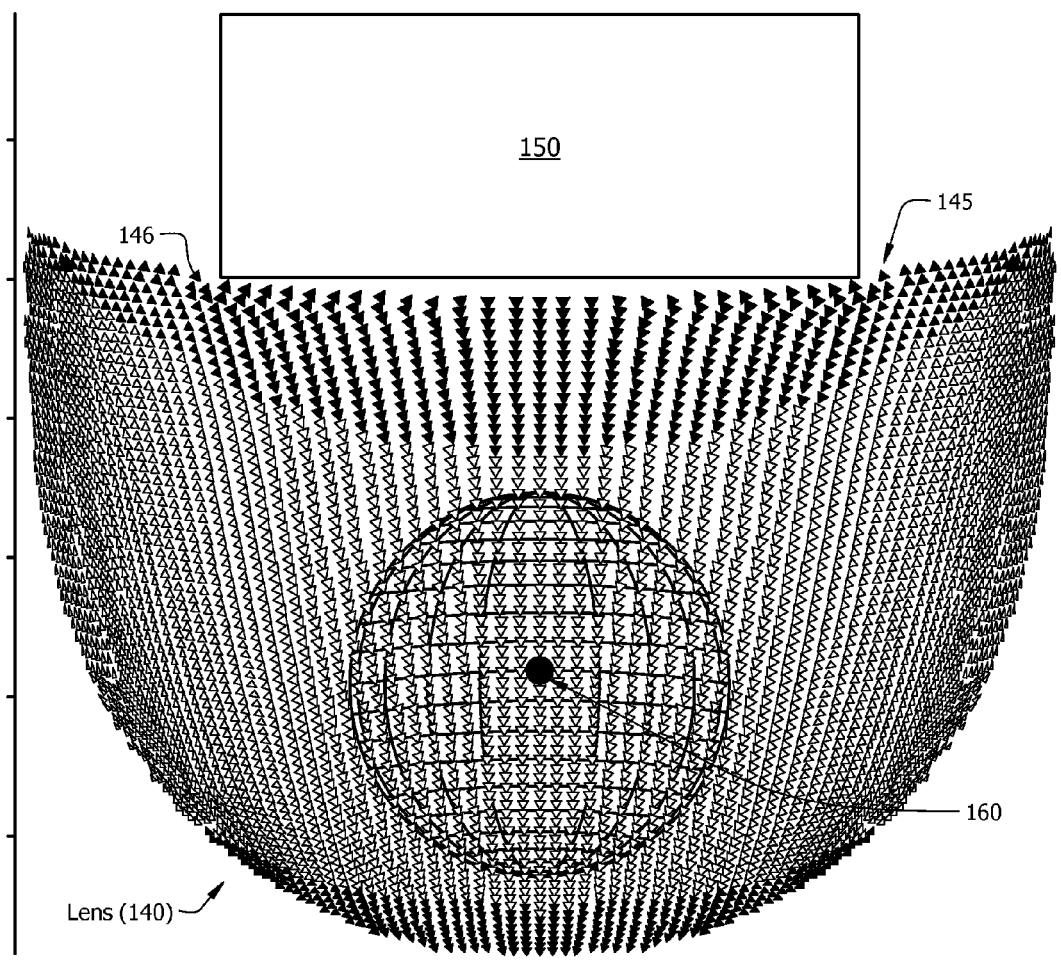
FIG. 1A is a front view of a disclosed lens having a 3D reflective surface made up of a plurality of individual reflective optical elements each having their own optical prescription, along with an eyeball and a pixel display screen (e.g., computer display panel), according to an example embodiment.

Disclosed embodiments are described with reference to the attached figures, wherein like reference numerals are used throughout the figures to designate similar or equivalent elements. The figures are not drawn to scale and they are provided merely to illustrate aspects disclosed herein. Several disclosed aspects are described below with reference to example applications for illustration. It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required in order to implement a methodology in accordance with this Disclosure.

Disclosed embodiments describe methods to constrain the motion of the surface elements during free-space optical design, that compose the surface in order that they intersect a ray that comes from a fixed reference point location, such as the center of the eye. There is generally one ray per surface element. These surface elements span the FOV and are used in the calculation of the free space wide field of view optical surface.

The use of a vector of motion (ray) for each oxel surface in the respective reflective surfaces ensures that each surface only moves on a vector with respect to a central point, for instance the center of the eye. Other processing is involved in determining the position of the surface in 3D space relating to the particular optical prescription for the entire surface, but each actual oxel surface is constrained to move on a vector from the central point out.

Figure 1B:
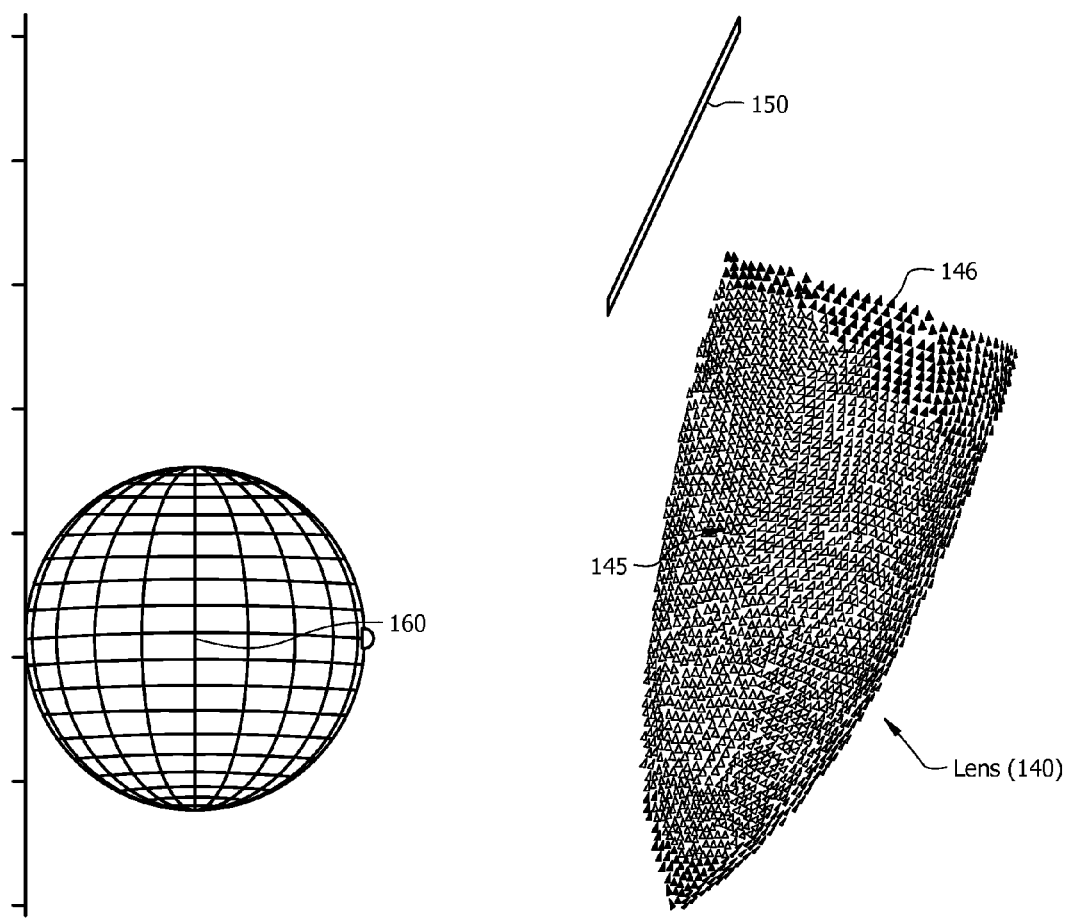
FIG. 1B is a side view of the lens shown in FIG. 1A along with the eyeball and pixel display screen.

FIG. 1A is a front view depiction of an example lens 140 including a disclosed reflective inner 3D surface 145 created using the oxel method having a plurality of reflective optical elements 146, while FIG. 1B is a side view depiction. Each triangle in the reflective inner 3D surface 145 shown represents an independent reflective optical element 146 that may move to represent a particular optical prescription on the reflective inner 3D surface 145. The prescriptions represented by disclosed reflective surfaces can be very complex in order to fully focus for oblique incident light across a wide FOV in a near-to-the-eye optical system. A pixel display screen (e.g., computer display panel) 150 and fixed reference location (point) shown as an eyeball 160 (which provides an eye point) is shown that is positioned so that a pixel (or small cluster of pixels) on the pixel display screen 150 which provides a light beam that reflects off the reflective optical elements 146 to reach the eyeball 160 (e.g., an eye point).

As can be seen in FIGS. 1A and 1B, the configuration of a disclosed reflective inner surface 145 of the lens 140 is complex and bears little resemblance to the spherical or aspherical surfaces created by other optical design techniques. Although not shown in FIGS. 1A and 1B, as described below, the individual reflective optical elements 146 are generally splined together to create a smooth continuous surface, so a large number (by way of a non-limiting example, thousands) of reflective optical elements 146 may fabricated on a common material to provide a reflective inner 3D surface 145 that is smooth at a fine grain level.

The Oxel method is described in detail in related patent application Ser. No. 13/211,389 entitled "Methods and Systems for Creating Free Space Reflective Optical Surfaces" where the surface is composed of thousands of oxels, which are small optical elements that express surface curvature which each define a small optical system, such as may each be used to reflect a single pixel from a pixel display screen to the eye of a user. The oxel design method can disclose in accordance with an aspect, a computer-based method for designing a free space reflective optical surface for use in a HMD apparatus that reflects a virtual image of a display surface (e.g., pixel display screen) for viewing at a preselected spatial location by a user's eye. The method comprises using one or more computers to perform the step of representing, by the one or more computers, the display surface by a plurality of display objects. The method also comprises using one or more computers to perform the step of representing, by the one or more computers, the free space reflective optical surface by a plurality of reflective surface elements.

Each reflective surface element may be characterized by (i) a spatial location relative to the display surface, the location of a nominal user's eye, and the preselected spatial location of the virtual image, (ii) a normal and (iii) a radius of curvature. The method also comprises using one or more computers to perform the step of associating, by the one or more computers, each display object with at least one surface element in the direction of which a virtual image of the display object at the preselected spatial location will be displayed to the nominal user's eye, each reflective surface element being associated with a single display object. For each reflective surface element, an initial spatial location of the element is defined.

For each reflective surface element, an initial direction of the element's normal using the element's initial spatial location, the location of the display object with which the reflective surface element is associated, and the location of a center of rotation of the nominal user's eye so that light from the display object that reflects off of the element will pass through the center of rotation is calculated, by the one or more computers. For each reflective surface element, an initial radius of curvature for the element so that the virtual image of the display object is focused at the user's eye is calculated, by the one or more computers. For each reflective surface element, a final spatial location of the element, a final direction of the element's normal, and a final radius of curvature for the element and a set of surrounding elements by iteratively adjusting the spatial locations of the elements until an error function satisfies a predetermined criterion is calculated by the one or more computers.

The oxel design method may be part of a system comprising a processor and a memory unit coupled to the processor where there the memory unit stores a computer program which includes programming instructions for performing the aforementioned method. In another aspect, a computer program embodied in a tangible computer medium may be provided for performing the aforementioned method.

The oxel design method can be a computer-based method for designing a free space reflective optical surface for use in a HMD that reflects a virtual image of a display surface for viewing by a user's eye. The method comprises using one or more computers to perform the step of representing, by the one or more computers, the display surface by a plurality of display objects. The method comprises using one or more computers to perform the step of representing, by the one or more computers, the free space reflective optical surface by a plurality of reflective surface elements. The method comprises using one or more computers to perform the step of iteratively calculating, by the one or more computers, at least a spatial location and at least a normal and at least an appropriate radius of curvature (lens power) for each surface element of the plurality of surface elements which will cause a virtual image of each display object to be displayed to a nominal user's eye in a desired direction of gaze of the eye for that display object.

Figure 2:
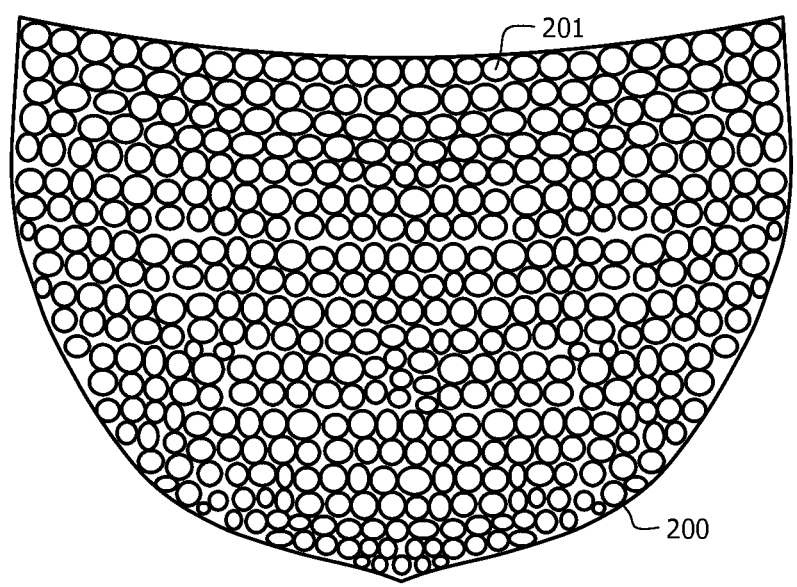
FIG. 2 depicts a plurality of oxels spread across a lens surface. There would generally be many more oxels than the number shown (e.g., in the thousands), and they would generally overlap.

After the oxel locations are set, the surface elements then represent a point cloud which is coated with a continuous surface, such as through the use of NURBS (Non-Uniform Rational B-Splines), to obtain the final reflective 3D surface. Example oxels 201 are shown in FIG. 2 each having different localized optical systems (different spherical and cylindrical corrections) spread across the reflective inner 3D surface 200, such as a reflecting mirror or reflecting concave lens. Each oxel 201 presents a solution for a single optical system, and the individual oxels are smoothed together, such as smoothing using NURBS to create a smoothly changing surface across the entire reflective inner 3D surface 200.

The alignment during the design adaptation can be essentially exact (error-free) relative to a given optical prescription across the area of the reflective surface as calculated because 3D positions can be placed exactly on the individual fixed line from the eye point out. Once the direction of the vector from the eye point has been determined, each sub-surface on that fixed line is not allowed to leave it during the entire calculation and adaptation process. This position can be carried through the computer aided design (CAD) step into manufacturing. With proper manufacturing technologies, the resulting reflective inside 3D surface of the lens will generally be within a few micrometers (e.g., <5 µms) of where it was calculated to be (based on a given optical prescription for the surface). It is only errors induced in manufacturing that result in disclosed reflective inside 3D surfaces to be offset from the vector.

Disclosed reflective 3D surfaces can thus be configured to focus a first image in light received so that objects in the first image appear to a user at a consistent virtual distance within a range from ±5% from an average virtual distance across the reflective 3D surface despite an angular spread of the light from respective ones of a plurality of pixels of the image display system to each of the plurality of reflective optical elements. This performance by disclosed reflective 3D surfaces can be provided over a wide available FOV to a user, such as a FOV of at least 150°.

Figure 3:
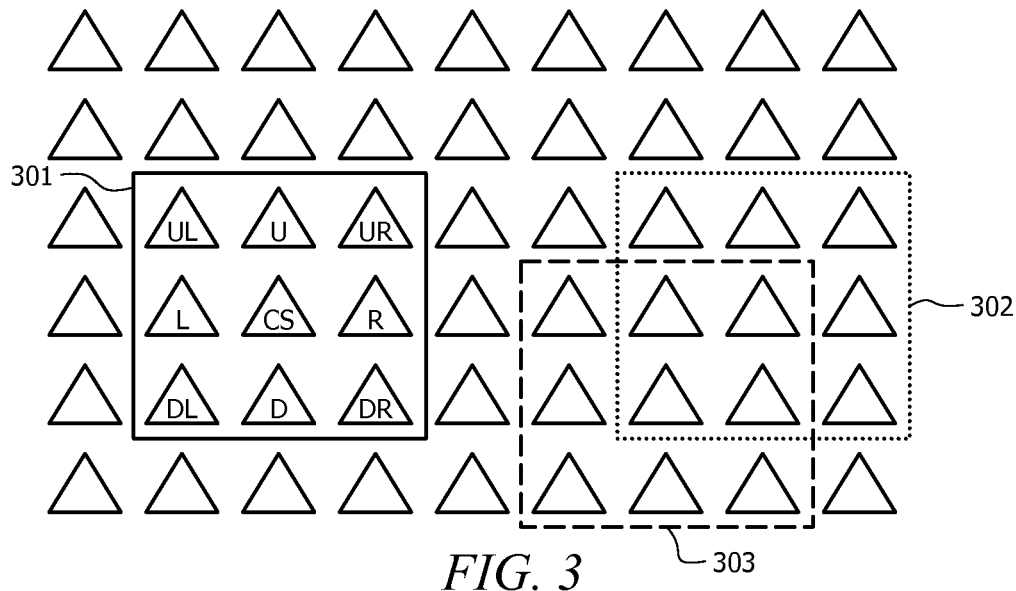
FIG. 3 depicts overlapping oxels that allow one oxel to affect the neighboring oxels around it. The nomenclature for oxel surface naming used herein is shown as CS=core sub-surface, and for the neighboring sub-surfaces U=Up, UR=Up Right, R=Right, DR=Down Right, D=Down, DL=Down Left, L=Left, and UL=Upper Left.

Each oxel can support a separate optical prescription including specific spherical and cylindrical settings. In one embodiment the oxel comprises a set of nine sub-surface elements as shown in FIG. 3 described below, where multiple oxels are shown superimposed on a section of the reflective inner 3D surface 200. One oxel is analyzed, modifications are determined as needed, and the next oxel can then be processed. After all oxels have been analyzed, the changes are applied to all the oxels at once and the process is repeated until a global error summation indicates that the overall error has fallen below a threshold, or has reversed direction and is increasing.

Figure 4:
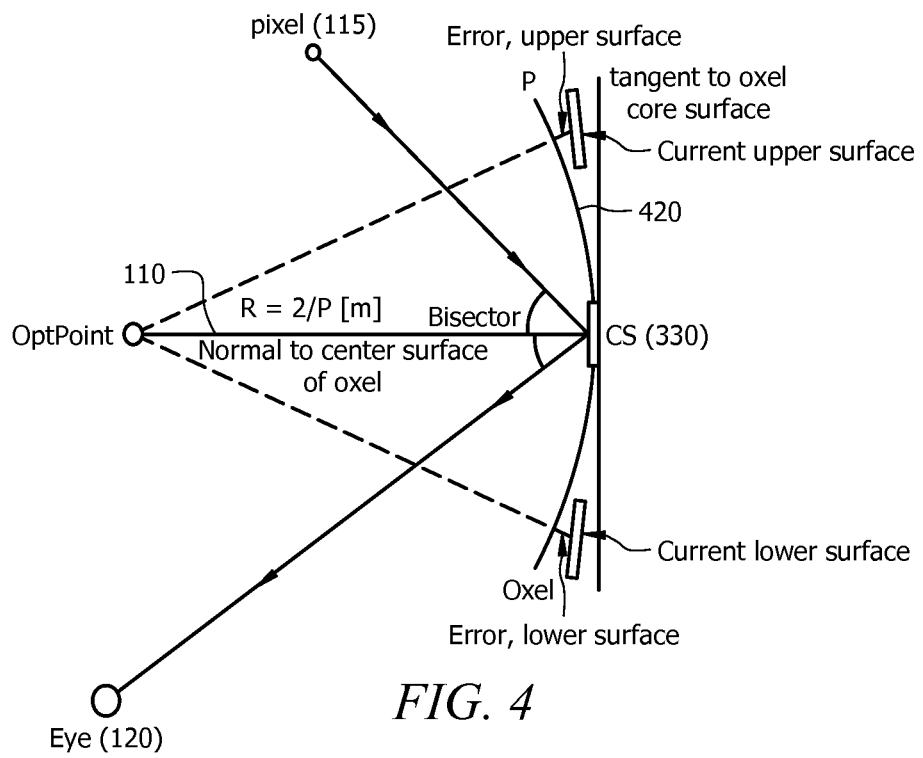
FIG. 4 shows how surface errors are detected in the current upper and current lower sub-surfaces of an oxel with respect to the optical system expected for use with and built around a particular CS. After the errors are detected, the next oxel can be processed, and so on to complete the design.

FIG. 3 shows oxels 301, 302 and 303 can overlap, with oxel 302 and 303 shown as overlapping, so that in the design each oxel may use some of the same sub-surface elements (UL, U, UR, L, CS, R, DL, D, DR), as one or more of its neighboring oxels. This allows iterative corrections in the design be made to a given oxel to also affect the neighboring oxels so that they may adapt together to distribute error across the whole surface and minimize the error through iterative small corrections to each oxel's surface position, as shown in FIG. 4. As noted above, "CS" stands for core (center) sub-surface. Each oxel has a CS and at least 4 neighboring sub-elements.

The CS of each oxel can remain unchanged for the design processing of a given oxel. However, in some implementations of the oxel adaptation calculations, only the movement for the CS and not the neighboring would be calculated for each oxel, although the adaptation is the same as calculated adaptations for neighboring sub-elements, just calculated in an outside-in manner. This alternate implementation helps to accommodate using a graphics processing unit-based method of calculating the adaptation. The neighboring sub-surfaces of CS 330, marked U, UL, L, DL, D, DR, R and UR, can be tested for how close they are to the expected surface for this particular oxel, such as described below as the optically corrected reference 3D surface 840 in FIG. 7.

In FIG. 4, the optical system shown is established for each oxel, and each oxel has its own CS as shown in FIG. 3. The centerline 110 of the optical system is shown from a point shown in FIG. 4 as the Optpoint providing a bisector to CS (normal to the center surface of CS). Each oxel is made to reflect light from a single pixel 115 (or a cluster of pixels), or other location on a pixel display screen, into a light receiver such as the fovea of the eye 120 of a user. The oxels are each angled to obtain the proper angle to reflect the light emitted from that pixel 115 (or cluster of pixels), so that the light enters the eye 120.

As indicated in FIG. 4, one way of creating disclosed reflective 3D surfaces is to compare the current 3D positions of the surfaces of neighboring sub-surfaces to the CS for each oxel to what would be the "optically corrected reference 3D surface" 420 which defines surface locations, where the optically corrected reference 3D surface 420 can correspond to the optically corrected reference 3D surface 840 shown in FIG. 7 described below. Optically corrected reference 3D surfaces establish a given set of optical properties (spherical and cylindrical corrections) that each oxel is determined to need based on a particular optical prescription for the reflective 3D surface. Errors are then detected in the respective neighboring sub-surface 3D positions relative to the surface locations on the ideal surface optically corrected reference 3D surface 420. The 3D error for each sub-surface element can be averaged over all the contributions from the oxels that contain that sub-surface element and a learning rate can be applied in order to only change (move) the sub-surface element 3D locations by a small amount (sub-moves) each time through the algorithm in an iterative fashion.

Figure 5:
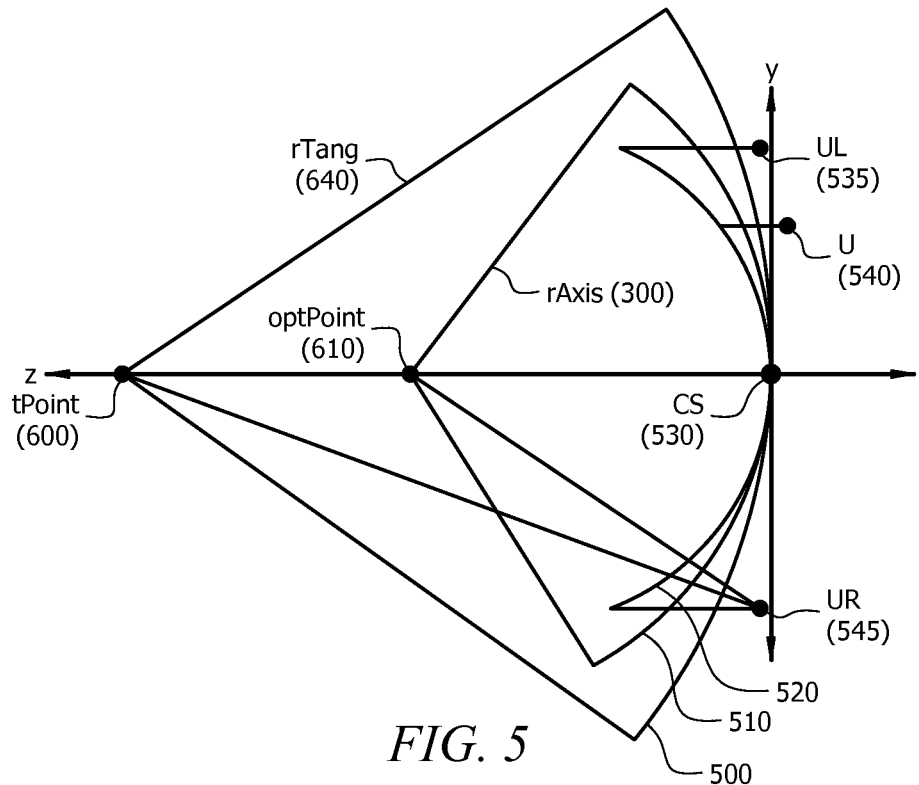
FIG. 5 shows an optically corrected reference 3D surface that was calculated based upon the optPoint for spheroidality and the tpoint that lies on the tangential cylindrical axis that determines the cylindrical correction up and down the x axis.

FIG. 5 shows respective errors in position of the sub-surface elements UL 535, U 540, and UR 545 with respect to the surface curvature of the optically corrected reference 3D surface 520 in the design process as horizontal bars. The error for U 540 can be seen to be less as compared to the error for UL 535 and UR 545. Surface curvature for the optically corrected reference 3D surface 520 is a summation of surface curvatures from spheroidal power correction 510 and cylindrical power correction 500 which are respectively governed by the optPoint 610 for spheroidality correction and the tpoint 600 for tangential cylindrical wave aberration correction shown in FIG. 5.

The correction for the oxel can be calculated based upon the locations of the optPoint 610 and the tPoint 600 shown in FIG. 5 described below. Since the oxel system shown in FIG. 5 is rotated into Body Referenced Coordinates (BRCs), the optPoint 610 and tpoint 600 lie on the normal axis to the CS 530 which is also the BRC z axis. Then the equation of a circle can be used to parametrically determine the height (z dimension) above the y plane in the z direction for the calculation on the xz plane.

In this case the equation of the circle for the tangential cylindrical correction is:

$$r\text{Tang}^2 = y_t^2 + z_t^2$$

where the t subscript denotes the tangential focus, and rTang 640 is the radius from the tangential cylindrical axis as shown in FIG. 5. This line is shown as cylindrical power correction 500 in FIG. 5. The equation for the sphere crossing the xz plane is:

$$r\text{Axis}^2 = y_a^2 + z_a^2$$

with the a subscript denoting the axis term, which are based upon the calculated spheroidality power for this oxel. This line is shown as spheroidal power correction 510 in FIG. 5.

Choosing a surface point, such as the sub-surface element UR 545, and denoting it as point P, and choosing to change just the z axis location of point P, allows the y coordinate of point P, $y_p$ to remain unchanged. Other methods of adaptation can be used also such as adapting in the direction of optPoint 610 and then in the direction of tpoint, but this method of just moving in the z direction will be shown to explain a method of adapting the oxel surface elements to obtain a desired optical correction. Thus $$y_a = y_p$$

and $$y_t = y_p$$

and the ideal y value for this sub-surface element of this oxel is:

$$y_i = y_p$$

With $y_p$ remaining unchanged in FIG. 5, the equation for the optically corrected reference 3D surface, including both spheroidality and cylindricality changes for a positive power, positive diopter cylindrical change is then:

$$z_i = z_a + z_t - \sqrt{r\text{Axis}^2 - y_p^2} + \sqrt{r\text{Tang}^2 - y_p^2}$$

For a negative power, negative diopter cylindrical change the ideal z value for this surface element is then $$z_i = z_a - z_t - \sqrt{r\text{Axis}^2 - y_p^2} - \sqrt{r\text{Tang}^2 - y_p^2}$$

These calculated (ideal) values define a 3D point in space that this surface element needs to vector towards, and an error vector from the existing surface element point to this calculated (ideal) point can be determined, as:

$$y_s = 0$$

$$z_e = z_i - z_p$$

showing that the change in surface element position is directed along the z axis, from the current z point $z_p$ to the ideal z point $z_i$. In three dimensions this also applies except the spheroidality calculations will be with respect to a single point and the cylindricality calculations will be with respect to a line axis.

There are clearly a large number of different directions that the sub-surface elements can move in response to the error to minimize the error. There is a spherical error that is established along the path to optPoint 610, there is a tangential error that is established along a path to tpoint 600, and there is a combined cylindrical and spherical surface that can be approached by moving the sub-surface element parallel to the normal of the CS 530 to intersect the optically corrected reference 3D surface 520 (having combined cylindrical and spherical error corrections). All of the paths have the potential to affect the full expected width of the FOV by compressing or expanding the lateral movements of the sub-surface elements UL 535, U 540, and UR 545 towards or away from optPoint 610 or tpoint 600, or potentially away from other oxel sets parallel to the surface normal. When this happens the overall expected FOV can change.

Figure 6:
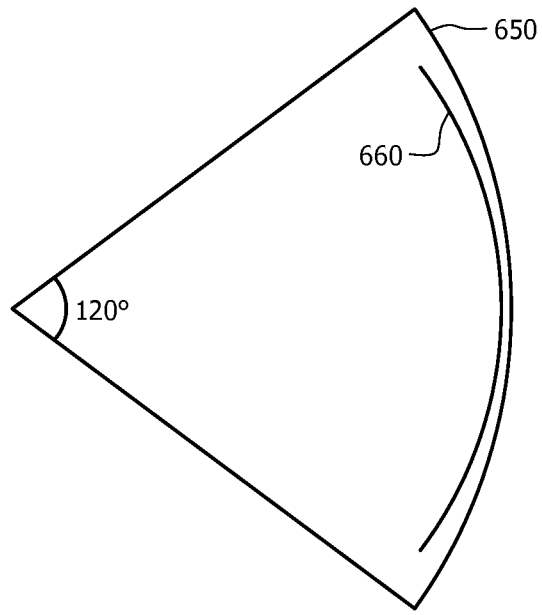
FIG. 6 shows how an initial FOV becomes a different FOV (shown as a smaller FOV) after automatic adjustments without disclosed globally controlling the expected radial locations of the surface elements.

At the start of disclosed free-space optical design processing, an initial surface can be established as a solid angle from a sphere surrounding the eye such that the pixel display screen can illuminate this entire solid angle and the eye can see it. From the top a 2D slice through that angle can be represented by the arc 650 shown in FIG. 6 for a 120 degree FOV. The reflective 3D surface 660 represents the surface after it has been adapted to provide the needed optical qualities without controlling the FOV, and is shown producing a FOV smaller than 120 degrees, which would have been larger than 120 degrees if the adaptation had taken it in the other direction (not shown).

To control the FOV provided by disclosed reflective inner 3D surfaces, throughout the adaptation of the oxels to provide the needed (desired) optical prescription for the surface, the sub-surface elements in one embodiment can be constrained to move only along a individual fixed line connecting them to a fixed reference location such as the center of the eye (an eye point). The sub-surface elements will still satisfy the surface optical curve qualities, but will only make sub-surface element adaptations that move it coincidental with their individual vector to the eye point (e.g., center of the eye) or other reference 3D point.

The mathematical equation describing the calculated (ideal) per-oxel surface can be computed and the 3D point where the vector from the sub-surface to the center of the eye (eye point) intersects can then be the location for this surface considering the optical prescription of this oxel. The optical prescription of the next oxel will likely result in a slightly different 3D location for a given surface, but will still move on a vector directed towards or away from the reference location, such as a 3D point considered to be the center of the eye.

This description illustrates the mathematics involved in the spherical adjustment of the surface element. Referring to FIG. 7, the eye point 800 is considered to be at location (x=0, y=0, z=0) of an example free space optical surface generation. This coordinate system is a Cartesian x, y, z, centered at the eye, termed eyespace, and has z positive down towards the neck, x positive out the front of the eye, and positive y out the right ear.

The optPoint 610 (see FIG. 5) is the center of the spherical optical system that has at its main optical axis CS 530. In FIG. 5 rAxis 300 is the distance from the optPoint to the CS and can remain constant during the calculation of the adjustments for all the neighboring sub-elements of CS during this epoch.

The description below shows an example calculation for determining the adjustment along the eye axis for any one of the neighboring sub-surface elements. The optPoint 610 is shown as having coordinates of (h, j, k) in a 3-tuple that specifies the x, y, and z coordinates in eyespace. By the definition of the sphere and the establishing of the optics system defined by rAxis 300 and the optPoint 610, $$Raxis^2 = (x-h)^2 + (y-j)^2 + (z-k)^2$$

where x, y, and z specify locations on the surface of the optical sphere. The 3D equation of the individual fixed line from the neighbor sub-surface, NS, perhaps representing the UR surface 545, to the eye is $$\vec{r}_l(t) = (0 + t\vec{v}_l)$$

where t represents the distance along the vector from the eye to the CS [0 . . . 1]

$\vec{r}_l(t)$ is the radial distance down the eye vector which can assume any distance between the eye and the neighboring sub-surface, and $\vec{v}_l$ is the unadapted location of the neighboring surface point, $P_{NS}$, such that $\vec{v}_l = P_{NS} \cdot x, P_{NS} \cdot y, P_{NS} \cdot z$)

using the a, b, c notation for ease in describing the quadratic equation to follow.

Thus, the equation for Raxis 300 may be written as $$Raxis^2 = (ta-h)^2 + (tb-j)^2 + (tc-k)^2$$

Factoring out t, and using r for Raxis 300, yields $$t^2 - t\frac{(2ah + 2bj + 2ck)}{a^2 + b^2 + c^2} + \frac{h^2 + j^2 + k^2 - r^2}{a^2 + b^2 + c^2} = 0 \quad 5$$

And solving this quadratic equation yields two solutions for t:

$$\begin{pmatrix} ah + bj + ck + \sqrt{\dfrac{-a^2 j^2 - a^2 k^2 + a^2 r^2 + 2abhj + 2achk - b^2 h^2 - }{b^2 k^2 + b^2 r^2 + 2bcjk - c^2 h^2 - c^2 j^2 + c^2 r^2}} \\ \hline a^2 + b^2 + c^2 \\ ah + bj + ck - \sqrt{\dfrac{-a^2 j^2 - a^2 k^2 + a^2 r^2 + 2abhj + 2achk - b^2 h^2 - }{b^2 k^2 + b^2 r^2 + 2bcjk - c^2 h^2 - c^2 j^2 + c^2 r^2}} \\ \hline a^2 + b^2 + c^2 \end{pmatrix} \quad 6$$

As an example test case, where
a=49.8377, b=0, c=−9.7475, h=−11.4, j=0, k=−43.8, and r=77.8742
returns two solutions, t=1.1943631 and t=−1.3039. The positive solution is chosen, as it will be on the correct side of the sphere, and indicates that the sub-surface should move down the eyepoint vector away from the eye. Substituting the answer for t into the line equation shows that the sub-surface should move towards:

$t\vec{v}_l = t(a,b,c)$ or, x=ta=59.5243099
y=tb=0.0
z=tc=−11.6420543

Finding the length of the vector from the eye to the expected location indicates that it has the correct length, Raxis:

$$length = \sqrt{(x-h)^2 + (y-j)^2 + (z-k)^2} = 77.8742$$

which is correct, matching the desired r, and it is co-linear with the eye vector by design, using the eye vector equation.

Figure 7:
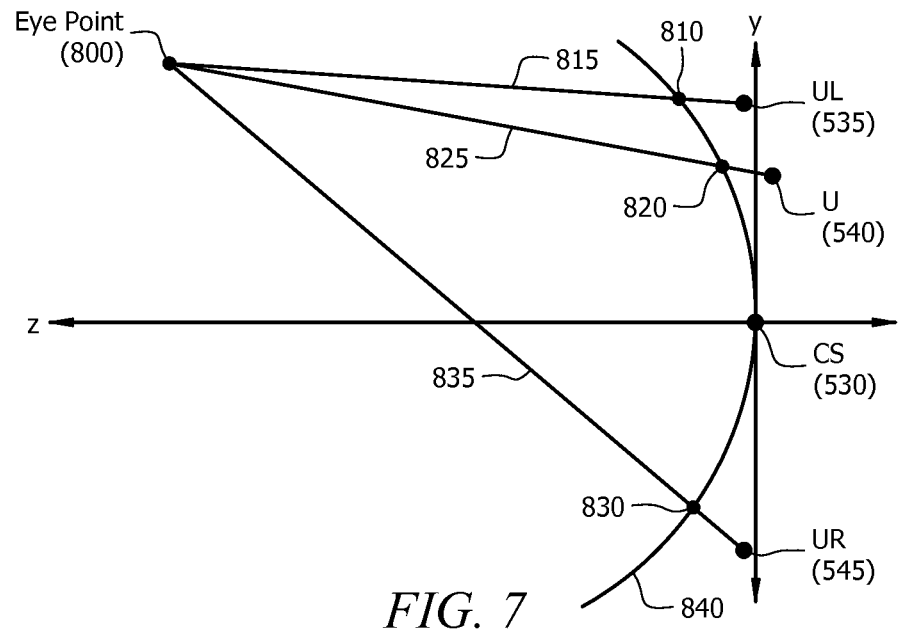
FIG. 7 shows disclosed surface adjustments where during correction the sub-surface elements are constrained to move only on an individual fixed line connecting them to a point associated with the eye.

FIG. 7 shows disclosed sub-surface adjustments (adaptations) where during correction the sub-surface elements are constrained to move only along an individual fixed line connecting them to a point associated with a reference 3D point shown as eye point 800. The position for eye point 800 is generally considered to be the rolling center of the eye, and thus connects the focused-upon reflective surface elements to the back of the eye as the eye looks in that direction. The proscribed eye location could also be set as a point in the lens of the eye of the user where an inversion of the optical rays of the outside (real) world occurs, in order to analyze peripheral imagery upon the sides of the retina.

The eye point 800 serves as a single common predetermined reference point to define the direction to which the individual fixed lines which may be referred to as adaptation radial lines 815, 825, 835 of the indicated neighboring sub-surface elements 535, 540, and 545, respectively, will be set to move towards until they intersect (or approach within a predetermined maximum error due to the intersection of multiple oxels), the optically corrected reference 3D surface 840 which includes all spheroidal and cylindrical power adjustments in the individual oxel design for all oxels (and resulting reflective 3D elements) in the reflective 3D surface as described above. Moving sub-surface element 535 along radial line 815 is shown intersecting optically corrected reference 3D surface 840 at point 810, moving sub-surface element 540 long radial line 825 is shown intersecting optically corrected reference 3D surface 840 at point 820, and moving sub-surface element 545 along radial lines 835 is shown intersecting optically corrected reference 3D surface 840 at point 830.

Since the sub-surface elements 535, 540, and 545 are constrained to only move along these radial lines 815, 825, 835 to the eye point 800 from which the FOV is measured, this constraint preserves the initial FOV provided in the spherical surface (e.g., arc 650 in FIG. 6) in the resulting optically corrected reflective 3D surface after surface adaptation (moving of the sub-surfaces of the oxels) while still satisfying the optical property requirements of the optical system because it incorporates preserving the FOV into the adaptation (moving of the sub-surfaces of the respective oxels).

Although the above-described method for performing correction involves adjusting the oxel components through independent sagittal- and tangential-direction cylindrical changes (bending), the amount of sagittal- and tangential-direction change can also be calculated using a different system that replaces independent orthogonal sagittal and tangential adjustments with a formulaically-combined adjustment using a biconic 3-dimensional equation applied to each oxel on the surface.

Figure 8:
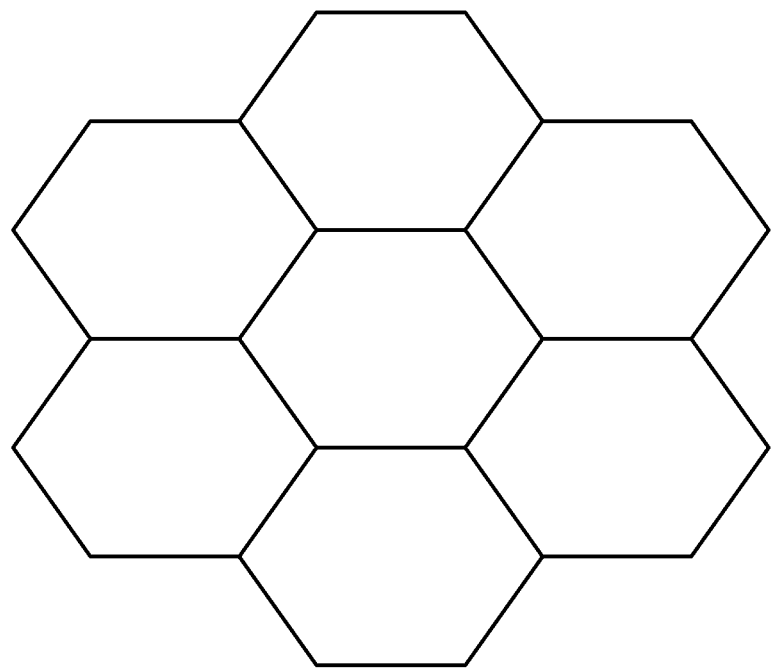
FIG. 8 depicts an alternative form of an oxel, shown as hexagonal. Many alternative forms are possible.

FIG. 8 shows an alternative form of oxel, shown as hexagonal. Many alternative shapes are also possible.

Figure 9A:
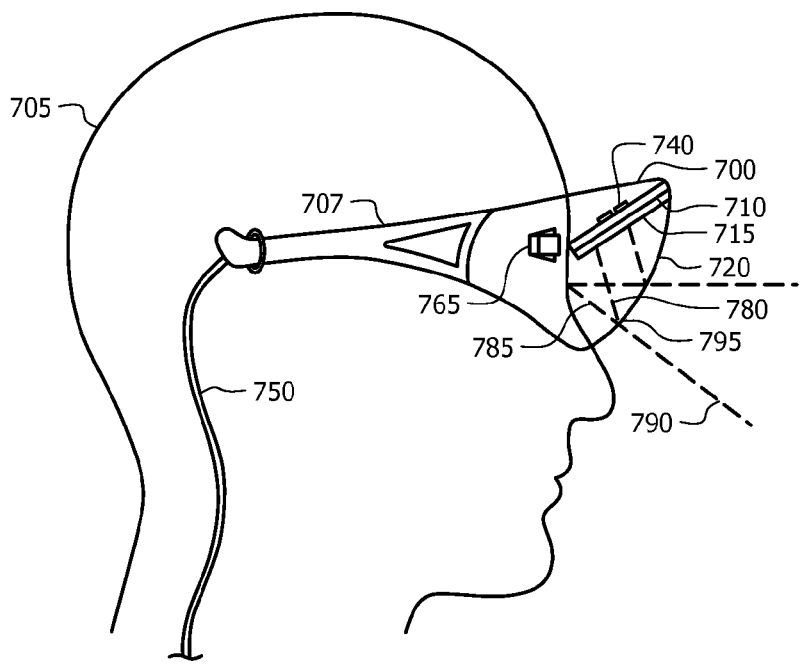
FIG. 9A is a side view representation of an example HMD apparatus including a disclosed reflective 3D surface including a plurality of reflective optical elements where the respective 3D points of the plurality of neighboring sub-elements for each reflective optical elements are aligned to an individual fixed line connecting each of the neighboring sub-elements to a single (common) predetermined reference point associated with a proscribed location of the HMD user's eye, according to an example embodiment.

FIG. 9A is a side view representation of an example HMD display apparatus 700 including a disclosed reflective inside 3D surface, according to an example embodiment. The reflective inside 3D surface includes a plurality of reflective optical elements including first and second reflective optical elements that provide a different combined optical power, each reflective optical element including a plurality of sub-elements including a CS and a plurality of neighboring sub-elements.

The respective 3D points of the plurality of neighboring sub-elements can be aligned to an individual fixed line connecting each neighboring sub-element to a proscribed location of the user's eye. Alternatively, as noted above, the CS in each oxel, rather than the neighboring sub-elements, can be aligned. The alignment during the design adaptation can be exact as the positions are calculated to be exactly on the individual fixed lines from the eye point out. Once the direction of the vector from the eye point has been determined, the sub-surface on that fixed line is not allowed to leave it during the entire calculation and adaptation process. This position is carried through the CAD step into manufacturing. With proper manufacturing technologies, the resulting reflective inside 3D surface of the lens will generally be within a few micrometers (e.g., <5 μms) of where it was calculated to be. It is only errors induced in manufacturing that cause disclosed reflective inside 3D surfaces to be offset from the vector.

The HMD can be an optical see-through HMD or a video see-through HMD. In the case of optical see-through, the lens can comprise a meniscus lens which is a thin lens having the same front and rear surface curvature so that the lens does not bend outside (real) world light.

Figure 9B:
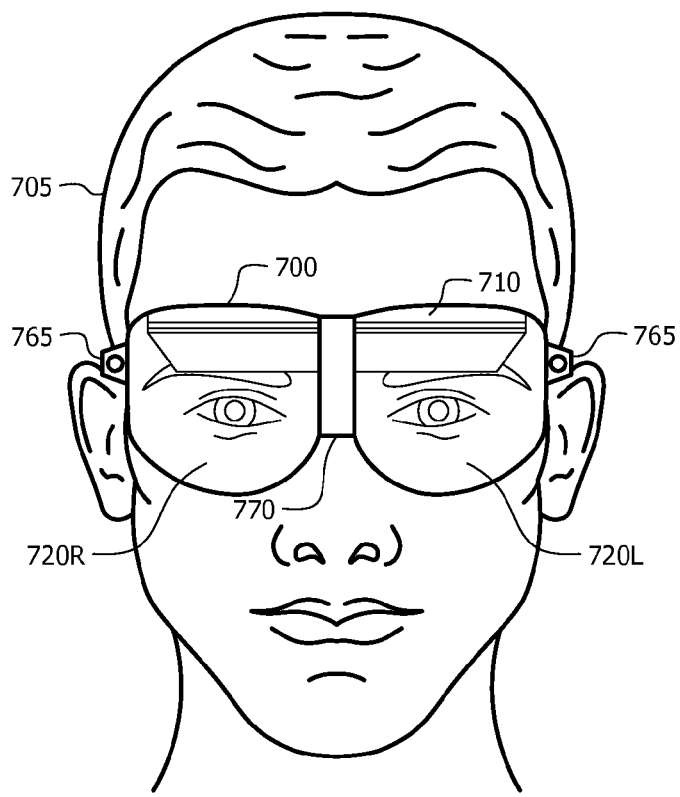
FIG. 9B is a front view representation of the example HMD apparatus shown in FIG. 9A.

FIG. 9B is a front view representation of the example HMD apparatus 700 of FIG. 9A. As shown in FIGS. 9A and 9B, the HMD apparatus 700 includes a frame 707 adapted to be worn by the user and supported by the user's nose and ears in a manner similar to that in which eyeglasses are worn. In the embodiment of FIGS. 9A and 9B, as well as in the other embodiments disclosed herein, the HMD may have a variety of configurations and can, for example, resemble conventional goggles, glasses, helmets, and the like. In some embodiments, a strap may be used to hold the HMD's frame in a fixed position with respect to the eyes of the user. In general terms, the outside surface of the HMD package can assume any form that holds the optical system in the required orientation with respect to the HMD's display(s) and the user's eyes.

The HMD apparatus 700 includes at least one image display system 710 and at least one optical system that includes a reflective optical surface which, as shown in FIGS. 9A and 9B is free space, wide angle lens 720 including a disclosed reflective inside 3D surface, which by necessity is curved. In some embodiments, the lens 720 can be the entire optical system. The lens 720 can be purely reflective or can have both reflective and transmissive properties, in which case, it can be thought of as a type of "beam splitter."

The lens 720 may completely surround one eye-, as well as the at least one image display system 710. There is one lens 720/image display system 710 per eye. They can butt up to one another and be made from the same (single) substrate, but due to the dependence upon the center of the eye, there is one system/lens per eye. In particular, the lens 720 can curve around the sides of the eyes and toward the sides of the face so as to expand the available horizontal FOV. In one embodiment, the lens 720 may extend up to 150° or more (e.g., more than 200).

As illustrated in FIG. 9B, the HMD apparatus 700 may include two separate lenses 720R and 720L for the user's two eyes which are separately supported by the frame and/or a nasal ridge piece 770 (see below). Alternately, the HMD apparatus 700 may employ a single lens 720 that serves both eyes with a single structure, some portions of which are viewed by both eyes and other portions of which are viewed by only one eye.

As noted immediately above and as illustrated in FIG. 9B, the HMD apparatus 700 can include a nasal ridge piece 770. The nasal ridge piece 770 can be a vertical bar or wall which provides a separation between lens 720L and lens 720R, one for each of the user's eye. The nasal ridge piece 770 can also provide a separation between the fields of view of the user's two eyes. In this way, the user's right eye can be shown a first representation of three dimensional physical reality in the environment by displaying a first image to the right eye via a first image display device and lens 720R, while the user's left eye is shown a second representation of three dimensional physical reality in the environment by displaying a second image to the left eye via a second image display device and lens 720L.

A separate display device/reflective surface combination thus services each eye of the user, with each eye seeing the correct image for its location relative to the three dimensional physical reality in the environment. By separating the user's two eyes, the ridge piece 770 allows the image applied to each eye to be optimized independently of the other eye. In one embodiment, the nasal ridge piece's vertical wall may include two reflectors, one on each side, to allow the user to see imagery as he/she turns his/her eyes nasally, either to the left or to the right.

The at least one image display system 710 can be mounted inside the lens 720. Alternatively, the at least one image display system can be located just outside of the lens 720. The tilt or angle of the at least one image display system 710 or, more particularly, its at least one light-emitting surface, will in general be a function of the location of the pixels, images, and/or pieces of display information that are to be reflected from the lens 720.

In certain embodiments, the HMD apparatus 700 is configured to create an interior cavity, with the lens 720 being reflective inward into the cavity. For a lens 720 having transmissive properties, the image or display information from the at least one image display system 710 is reflected into the cavity and to the user's eye from the surface while, simultaneously, light also enters the cavity and the user's eye from the external world by passing through the reflective surface.

The image display system 710 has a plurality of pixels which emit light representing imagery. A wide variety of imagery may be used including text, computer screens, financial graphs, television (TV) shows, first-person computer games, such as from a video source, where a video camera is supplying the imagery to be displayed on the HMD apparatus 700. In one particular embodiment the imagery includes virtual objects from virtual object data received from a computing system, which would be like calculated and rendered avatars.

In certain embodiments, the at least one image display system 710 provides images and/or pieces of display information that prior to entering the user's eye(s) are adjusted for near viewing. In some embodiments, an optional lens or lens system 715 may contribute to this adjusting. One or more Fresnel lenses can be used for this purpose. Other embodiments do not utilize the optional lens or lens system, and instead rely on the lens 720 to provide desired optical properties for in-focus, near-to-the-eye viewing of the images formed by the display system.

The HMD apparatus 700 can include an electronics package 740 to control the images that are displayed by the at least one image display system 710. In one embodiment, the electronics package 740 includes accelerometers and gyroscopes that provide location, orientation and position information needed to synchronize images from the at least one image display system 710 with user activities. Power and video to and from the head-mounted display apparatus 700 can be provided through a transmission cable 750 coupled to the electronics package 740 or through a wireless medium.

A set of cameras 765 may be situated on opposite sides of the HMD apparatus 700 to provide input to the electronics package to help control the computer generation of, for example, "augmented reality" scenes. The set of cameras 765 may be coupled to the electronics package 740 to receive power and control signals and to provide video input to the electronics package's software.

The image display system 710 used in the HMD apparatus 700 can take many forms, now known or subsequently developed. For example, the system can employ small high resolution liquid crystal displays (LCDs), light emitting diode (LED) displays, and/or organic light emitting diode (OLED) displays, including flexible OLED screens. In particular, the image display system can employ a high-definition small-form-factor display device with high pixel density, examples of which may be found in the cell phone industry. A fiber-optic bundle can also be used in the image display system. In various embodiments, the image display system can be thought of as functioning as a small screen television. If the image display system produces polarized light (e.g., in the case where the image display system employs a liquid crystal display where all colors are linearly polarized in the same direction), and if the lens 720 is polarized orthogonally to the light emitted by the display, then light may not leak out of the lens 720. The information displayed and the light source itself will accordingly not be as visible outside of the HMD apparatus 700.

Overall operation of an example embodiment of an optical system, specifically, an optical system for an "augmented reality" HMD, is illustrated by the ray-tracings of FIG. 9A, specifically, light rays 780, 785, and 790. In this embodiment, lens 720 has both reflective and transmissive properties. Using len's 720 transmissive properties, light ray 790 enters from the environment through the surface and proceeds towards the user's eye. From the same region of lens 720, light ray 780 is reflected by the surface (using the surface's reflective properties) and joins light ray 790 to create combined light ray 785 that enters the user's eye when the user looks in the direction of point 795, i.e., when the user's direction of gaze is in the direction of point 795. While so looking, the user's peripheral vision capabilities allow the user to see light from other points in the environment which pass lens 720, again using the surface's transmissive properties.

Disclosed embodiments are significant since they achieve control of a very wide FOV for reflective lenses generated using disclosed free-space optical design methods. This allows crisp and bright imagery to be seen in a large FOV reflective lens, supporting a more natural immersion in a virtual reality or wider and more lifelike object insertion into the view area of a user of an optical see-through AR system.

There are a variety of methods to form reflective lenses from disclosed constrained free-space optical design methods As described above, oxels are not physical objects, nor can they be seen or represented in a physical object as they are surface elements being points that define the location of the optical surface. The points are interconnected to make a smooth surface through each surface element using non-uniform rational basis spline (NURBS) which is a mathematical model commonly used in computer graphics for generating and representing curves and surfaces, for example. Methods that can be used to create oxel-derived reflective surfaces for real-world applications (e.g., for optical see-through AR HMD displays) include 3D printing of a CAD model containing the exact mathematical surface. Other methods include Single Point Diamond Turning (SPDT) machining of materials such as polycarbonate or aluminum, and through plastic mold technology including hot embossing of polycarbonate or injection molding. Laser ablation may also be possible.

Disclosed embodiments are described with reference to the attached figures, wherein like reference numerals, are used throughout the figures to designate similar or equivalent elements. The figures are not drawn to scale and they are provided merely to illustrate aspects disclosed herein. Several disclosed aspects are described with reference to example applications for illustration.

It should be understood that numerous specific details, relationships, and methods are set forth to provide a full understanding of the embodiments disclosed herein. One having ordinary skill in the relevant art, however, will readily recognize that the disclosed embodiments can be practiced without one or more of the specific details or with other methods. In other instances, well-known structures or operations are not shown in detail to avoid obscuring aspects disclosed herein. Disclosed embodiments are not limited by the illustrated ordering of acts or events, as some acts may occur in different orders and/or concurrently with other acts or events. Furthermore, not all illustrated acts or events are required in order to implement a methodology in accordance with this Disclosure.

While various disclosed embodiments have been described above, it should be understood that they have been presented by way of example only, and not as a limitation. Numerous changes to the disclosed embodiments can be made in accordance with the Disclosure herein without departing from the spirit or scope of this Disclosure. Thus, the breadth and scope of this Disclosure should not be limited by any of the above-described embodiments. Rather, the scope of this Disclosure should be defined in accordance with the following claims and their equivalents.

Although disclosed embodiments have been illustrated and described with respect to one or more implementations, equivalent alterations and modifications will occur to others skilled in the art upon the reading and understanding of this specification and the annexed drawings. While a particular feature may have been disclosed with respect to only one of several implementations, such a feature may be combined with one or more other features of the other implementations as may be desired and advantageous for any given or particular application.

The invention claimed is:

1. A lens, comprising:
   a material spanning an area providing a curved inside reflective three-dimensional (3D) surface;
   wherein said inside reflective 3D surface is defined by a plurality of reflective optical elements including a first reflective optical element and at least a second reflective optical element that each include a plurality of sub-elements including a center sub-element (CS) and a plurality of neighboring sub-elements;
   wherein an entire surface area of said inside reflective 3D surface consists of a single smoothly changing surface radius of curvature;
   wherein said first reflective optical element having first non-zero optical power and said second reflective optical element having second non-zero optical power provide a different non-zero combined optical power each including a spheroidal power correction and a cylindrical power correction, and
   wherein a 3D point on at least a first of said plurality of sub-elements for each of said first reflective optical element and said second reflective optical element are both aligned to an individual fixed line connecting to a single predetermined reference point.

2. The lens of claim 1, wherein all of said plurality of reflective optical elements provide said different non-zero combined optical power.

3. The lens of claim 1, wherein said inside reflective 3D surface of said lens provides a particular optical prescription for each of said plurality of reflective optical elements so that said area of said inside reflective 3D surface focuses an incident beam of light of a first image so that objects in said first image appear to a user at a consistent virtual distance within in a range from ±5% from an average virtual distance across said inside reflective 3D surface despite an angular spread of light from a pixel source to each of said plurality of reflective optical elements.

4. The lens of claim 1, wherein said lens comprises a beam splitter and said material is partially transmissive to visible light.

5. The lens of claim 4, wherein said lens comprises a meniscus lens having a same said radius of curvature for an outside surface of said lens and said inside reflective 3D surface.

6. The lens of claim 1, wherein said inside reflective 3D surface provides a field of view to a nominal user of at least 120°.

* * * * *